United States Patent
Bhatt et al.

(10) Patent No.: US 8,552,560 B2
(45) Date of Patent: Oct. 8, 2013

(54) ALTERNATE PAD STRUCTURES/PASSIVATION INEGRATION SCHEMES TO REDUCE OR ELIMINATE IMC CRACKING IN POST WIRE BONDED DIES DURING CU/LOW-K BEOL PROCESSING

(75) Inventors: Hemanshu Bhatt, Vancouver, WA (US); Dilip Vijay, Redwood City, CA (US); Jayanthi Pallinti, Santa Clara, CA (US); Sey-Shing Sun, Portland, OR (US); Hong Ying, Cupertino, CA (US); Chiyi Kao, San Jose, CA (US)

(73) Assignee: LSI Corporation, San Jose, CA (US)

( * ) Notice: Subject to any disclaimer, the term of this patent is extended or adjusted under 35 U.S.C. 154(b) by 37 days.

(21) Appl. No.: 11/283,219

(22) Filed: Nov. 18, 2005

(65) Prior Publication Data

US 2007/0114667 A1    May 24, 2007

(51) Int. Cl.
*H01L 21/31*    (2006.01)
(52) U.S. Cl.
USPC ............ 257/758; 257/E23.02; 257/E23.012
(58) Field of Classification Search
USPC ................. 257/758, E23.02, E23.012, 737
See application file for complete search history.

(56) References Cited

U.S. PATENT DOCUMENTS

| | | | |
|---|---|---|---|
| 5,106,461 A | 4/1992 | Volfson et al. | |
| 5,128,737 A | 7/1992 | van der Have | |
| 5,248,903 A | 9/1993 | Heim | |
| 5,656,858 A | 8/1997 | Kondo et al. | |
| 5,659,201 A | 8/1997 | Wollesen | |
| 5,751,065 A | 5/1998 | Chittipeddi et al. | |
| 5,854,514 A | 12/1998 | Roldan et al. | |
| 6,037,664 A | 3/2000 | Zhao et al. | |
| 6,187,680 B1* | 2/2001 | Costrini et al. | 438/688 |
| 6,306,750 B1* | 10/2001 | Huang et al. | 438/612 |
| 6,350,705 B1 | 2/2002 | Lin | |
| 6,426,556 B1 | 7/2002 | Lin | |
| 6,440,833 B1* | 8/2002 | Lee et al. | 438/601 |
| 6,563,216 B1* | 5/2003 | Kimura et al. | 257/737 |
| 6,614,091 B1 | 9/2003 | Downey et al. | |
| 6,620,720 B1 | 9/2003 | Moyer et al. | |
| 6,642,597 B1 | 11/2003 | Burke et al. | |
| 6,689,680 B2 | 2/2004 | Greer | |
| 6,717,270 B1 | 4/2004 | Downey et al. | |
| 6,743,979 B1 | 6/2004 | Berman et al. | |
| 6,798,035 B1 | 9/2004 | Low et al. | |
| 6,825,563 B1 | 11/2004 | Ranganathan et al. | |
| 6,841,872 B1 | 1/2005 | Ha et al. | |

(Continued)

FOREIGN PATENT DOCUMENTS

WO    03/079434 A2    9/2003

*Primary Examiner* — Wael Fahmy
*Assistant Examiner* — Sarah Salerno
(74) *Attorney, Agent, or Firm* — Clark Hill PLC (57) ABSTRACT

Passivation integration schemes and pad structures to reduce the stress gradients and/or improve the contact surface existing between the Al in the pad and the gold wire bond. One of the pad structures provides a plurality of recessed pad areas which are formed in a single aluminum pad. An oxide mesa can be provided under the aluminum pad. Another pad structure provides a single recessed pad area which is formed in a single aluminum pad, and the aluminum pad is disposed above a copper pad and a plurality of trench/via pads. Still another pad structure provides a single recessed pad area which is formed in a single aluminum pad, and the aluminum pad is disposed above a portion of a copper pad, such that the aluminum pad and the copper pad are staggered relative to each other.

3 Claims, 11 Drawing Sheets

(56) References Cited

U.S. PATENT DOCUMENTS

| | | |
|---|---|---|
| 6,864,578 B2 * | 3/2005 | Angell et al. ............... 257/737 |
| 7,049,170 B2 | 5/2006 | Savastiouk et al. |
| 7,160,805 B1 | 1/2007 | Burke et al. |
| 7,242,099 B2 | 7/2007 | Lin et al. |
| 7,301,231 B2 | 11/2007 | Antol et al. |
| 7,364,998 B2 * | 4/2008 | Chiu et al. ................ 438/597 |
| 2001/0051426 A1 * | 12/2001 | Pozder et al. ............ 438/666 |
| 2003/0127502 A1 | 7/2003 | Alvarez |
| 2003/0222348 A1 * | 12/2003 | Okada ........................ 257/758 |
| 2004/0134974 A1 | 7/2004 | Oh et al. |
| 2004/0201101 A1 | 10/2004 | Kang et al. |
| 2006/0006552 A1 * | 1/2006 | Kang et al. ................ 257/786 |

\* cited by examiner

ALTERNATE PAD STRUCTURES/PASSIVATION INEGRATION SCHEMES TO REDUCE OR ELIMINATE IMC CRACKING IN POST WIRE BONDED DIES DURING CU/LOW-K BEOL PROCESSING

BACKGROUND

The present invention generally relates to wire bonds, and more specifically relates to pad structures and passivation schemes to reduce or eliminate IMC cracking in post wire bonded dies during Cu/Low-K BEOL processing.

Figure 1:
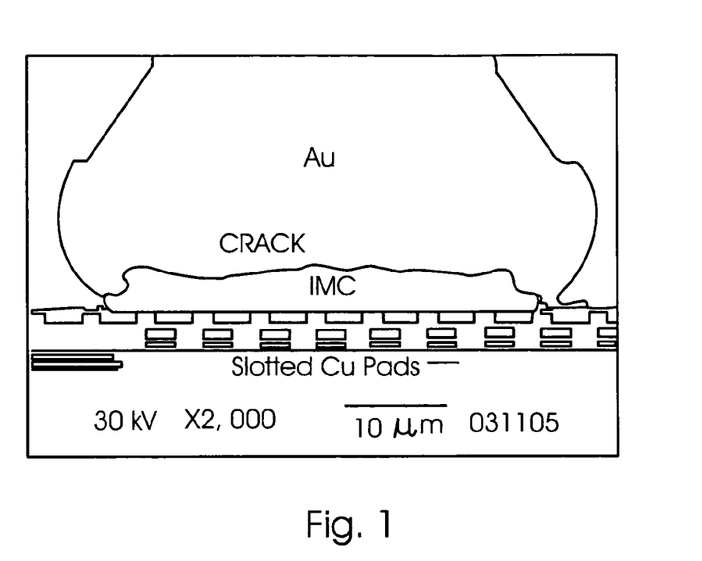
FIG. 1 is an X-SEM of a bonded die, showing IMC cracking.

It has been observed that some post wire bonded dies that have undergone Cu/Low-K metallization show signature of 'open' fails after several hours of HTS (high temperature storage). Failure analysis on such parts shows cracks at the interface of intermetallic compound (IMC) and gold bond. FIG. 1 shows an X-SEM of a bonded die with IMC cracking.

Historically, IMC cracking in Au—Al wirebonds have been attributed to several causes including contamination on the surface of the Al-pads, incompatible film properties of the Al-films, presence of halides in the molding compounds, excessive levels of voids in the molding compounds and poorly optimized bonding and molding conditions. However, in the case of wire bond devices with Cu/Low-k metallization, the cracking of IMC persists despite careful control of the above-mentioned factors. Through a cumulative set of deductive experiments and use advanced analytical techniques, it has been determined that the cracking of IMC wire bond devices with Cu/Low-k metallization is a strong function of the tensile stresses in the film. It has been found that the unusually high tensile stresses generated in the Cu/Low-K stacks can drive excessive diffusion of Al into the Au bonds leading to very thick and Al-rich IMC phases. The unstable Al-rich phases eventually undergo reverse phase transformations to Au-rich phases; the associated volume change (very large~30%) in such phase transformations can result in voiding and eventual cracking of the IMC. The way to prevent this issue then is to tailor the stresses in the Cu/Low-K stacks so that the Al-diffusion rates are controlled to a low enough level that the stable Au-rich phases are formed preferably when compared to Al-rich phases. This will prevent any tendencies for phase transformation in the system.

Stress Build-up:

The present invention addresses the stress related issues that cause the IMC cracking and methods to eliminate the IMC cracking by controlling the macro stresses in the wafer. During Cu/Low-k processing, it has been found that there is cumulative stress buildup in wafers due to intrinsic stresses in metal and dielectric films and due to various thermal cycles. Thermal stresses are generated due to a mismatch between the temperature coefficients of expansion between metal, dielectric films and substrate, as illustrated in the following table:

| Material | Coefficient of thermal expansion for various film (per degree Celsius) |
|---|---|
| Al | 2.2E−05 |
| Cu | 1.7E−05 |
| Ti/TiN | 9.0E−06 |
| Ta/TaN | 6.0E−06 |
| Si | #.0E−06 |
| SiO$_2$ | 5.5E−07 |

Intrinsic stresses are generated during deposition. The stress state can be evaluated with freestanding films (or films on flexible substrates). Some general observations regarding stresses in thin films is provided below for reference:

1. Tensile: typically, an upward curve is generated due to repulsive forces between tapered grains in zone 1 structure formed by evaporation or sputtering with high pressure and low power.
2. Compressive: typically, a downward curve is generated due to atomic peening of crystal grains by reflected neutrals during sputtering.
3. Metals with Body Centered Cubic (BCC) structure, e.g., W, Ta (mostly refractory metals), can have extremely high compressive stress due to open lattice that allows atoms to be easily displaced.
4. Metals with Face Centered Cubic (FCC) structure, e.g., Cu, Al and Au (most noble metals), have very little intrinsic stress (low re-crystallization temperature).
5. Dielectric (CVD) films can be tensile or compressive depending on deposition parameters, e.g., temperature and plasma power.

Figure 2:
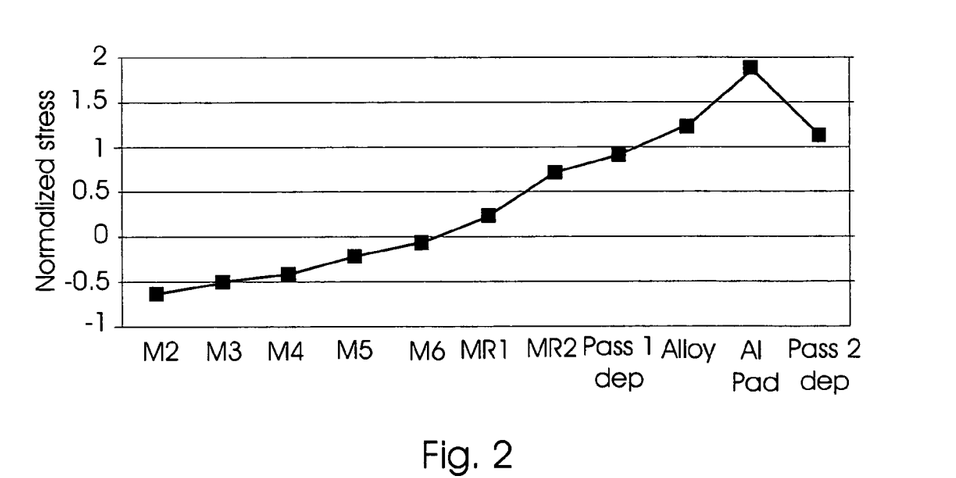
FIG. 2 is a graph which shows normalized stress on a wafer at various metallization steps in the BEOL Cu/Low-k steps, wherein a positive value for stress indicates tensile stress and a negative value for stress indicates compressive stress.
Figure 3:
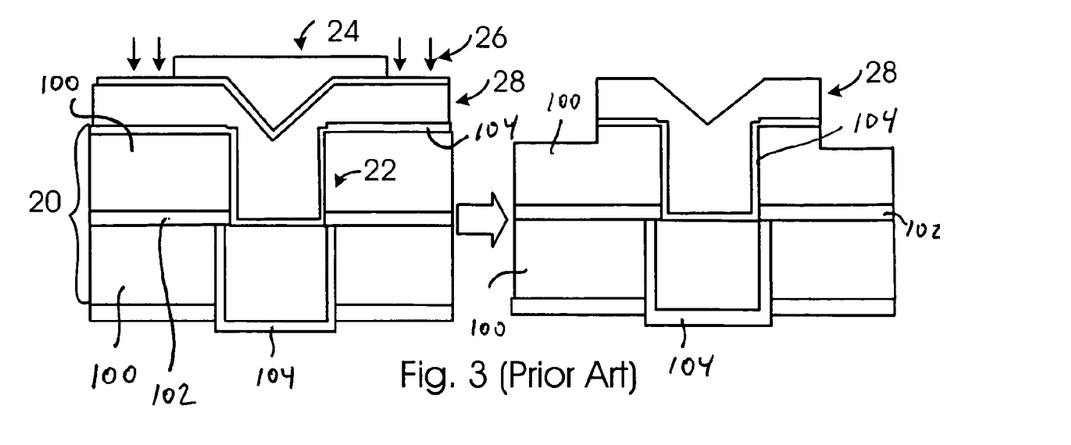
FIG. 3 provides cross-sectional views relating to a prior art passivation scheme, wherein aluminum pads are defined post R2 module.

The macro stresses in the wafer can be measured by measuring the bow in the wafer and translating the values to stresses through Poisson's equations. In general, a positive wafer gap during the wafer bow measurement indicates tensile stresses in the wafers and a negative wafer gap indicates compressive stresses. FIG. 2 shows a normalized graph with stress accumulated on a wafer at various stages in the BEOL Cu/Low-k wafer processing.

It is evident from FIG. 2 that the tensile stresses on the wafer keep increasing in the wafer as more and more metallization steps are added to the film and the wafer experiences maximum tensile stress during deposition of the Aluminum pad. Aluminum and copper are known to contribute to tensile stresses, while the dielectric films can contribute to tensile or compressive stresses based on deposition conditions like temperature, time, etc. As the tensile stresses in the wafer build-up, the wafer can bow due to the warpage or macro stress distributions from the center to the edge of the wafer. However, the local stress distribution in the Aluminum pads is harder to characterize.

OBJECTS AND SUMMARY

An object of an embodiment of the present invention is to provide a passivation integration scheme and pad structure which provides for more uniform IMC formation and increased surface area.

Another object of an embodiment of the present invention is to provide a passivation integration scheme and pad structure which provides for a reduction in IMC crack initiation and propagation between the Al—Au interface and for improved reliability of wire bonded parts with Cu/Low-K metallization.

Briefly, and in accordance with at least one of the foregoing objects, the present invention is directed at providing passivation integration schemes and pad structures to reduce the stress gradients and/or improve the contact surface existing between the Al in the pad and the gold wire bond. One of the pad structures which is in accordance with an embodiment of the present invention provides a plurality of recessed pad areas which are formed in a single aluminum pad. An oxide mesa can be provided under the aluminum pad. Another pad structure which is in accordance with an embodiment of the present invention provides a single recessed pad area which is formed in a single aluminum pad, and the aluminum pad is disposed above a copper pad and a plurality of trench/via pads. Still another pad structure which is in accordance with an embodiment of the present invention provides a single recessed pad area which is formed in a single aluminum pad, and the aluminum pad is disposed above a portion of a copper pad, such that the aluminum pad and the copper pad are staggered relative to each other.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

While the invention may be susceptible to embodiment in different forms, there are shown in the drawings, and herein will be described in detail, specific embodiments of the invention. The present disclosure is to be considered an example of the principles of the invention, and is not intended to limit the invention to that which is illustrated and described herein.

The present invention proposes modified passivation integration schemes and pad structures to reduce the stress gradients and/or improve the contact surface existing between the Al in the pad and the gold wire bond. This results in more uniform IMC formation and increased surface area, and helps in reducing the IMC crack initiation and propagation between the Al—Au interface and improve the reliability of wire bonded parts with Cu/Low-K metallization.

In FIGS. 3-7, 9, 10 and 14, reference numeral 100 is used to identify oxide, reference numeral 102 is used to identify SiN, and reference numeral 104 is used to identify a barrier layer.

For comparison, a prior art passivation scheme is as follows:

1. Define aluminum pads post R2 Module (see FIG. 3).
   a. Deposit Passivation 1 Stack (SiN/Oxide) (identified with reference numeral 20 in FIG. 3);
   b. Passivation 1 mask and etch to define the pad and/or fuse area (identified with reference numeral 22 in FIG. 3);
   c. TaN/Al—Cu metal stack and hard mask (SiON) deposition; and
   d. Aluminum pad mask and etch (in FIG. 3, the mask is identified with reference numeral 24, the etching is represented by arrows 26, and the aluminum pad is identified with reference numeral 28).

2. Passivation 2 and opening of the pad (final pad structure) (see FIG. 4).
   a. Deposit Passivation 2 Stack (Oxide/SiN/Oxide/SiN) (identified with reference numeral 30 in FIG. 4);
   b. Passivation 2 mask and etch to open the pad area for bonding (in FIG. 4, the pad area is identified with reference numeral 32)

Figure 4:
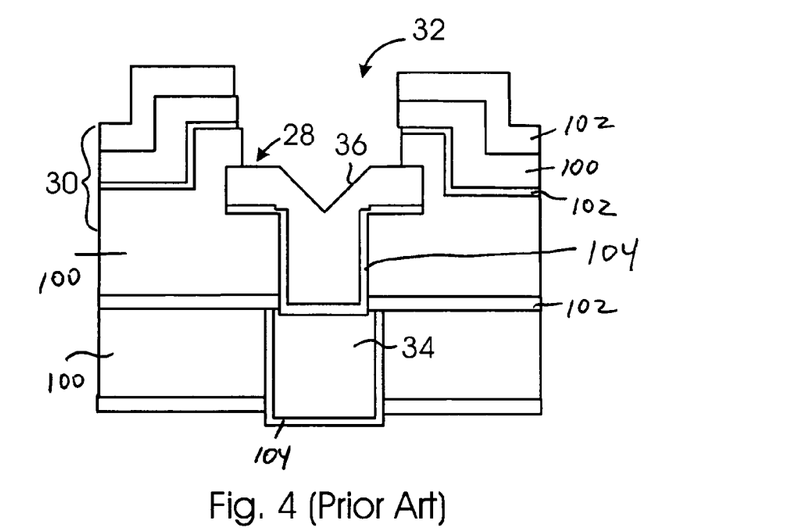
FIG. 4 provides a cross-sectional view relating to the prior art passivation scheme, wherein a passivation 2 stack is deposited and a pad area is opened for bonding.

As shown in FIG. 4, this passivation scheme provides that a single copper pad 34 is disposed under an aluminum pad 28 which has a single pad area 36 formed therein for bonding to a wire.

Figure 6:
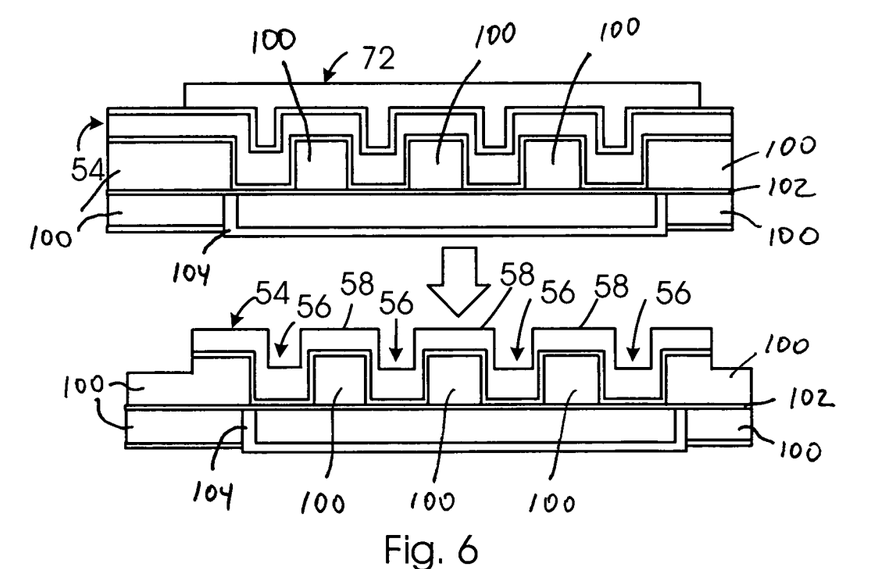
FIG. 6 provides cross-sectional views relating to the passivation scheme which is in accordance with an embodiment of the present invention, wherein a plurality of slots are formed in an aluminum pad.
Figure 7:
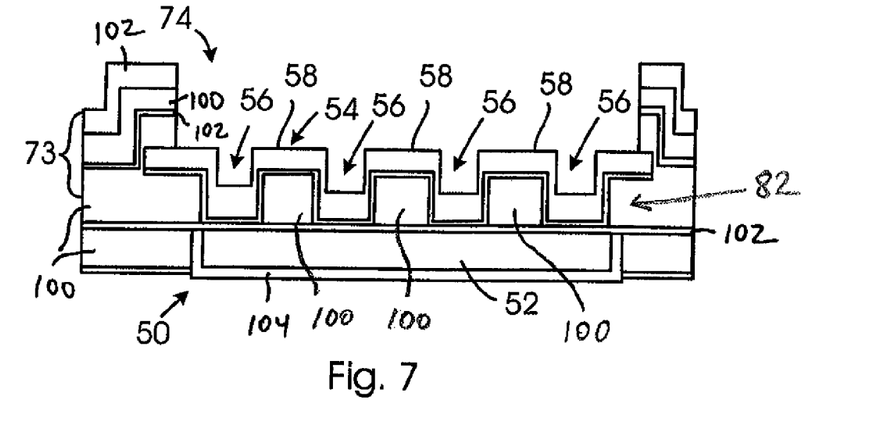
FIG. 7 provides a cross-sectional view relating to the passivation scheme which is in accordance with an embodiment of the present invention, wherein a passivation 2 stack is deposited and a pad area is opened for bonding.

In contrast, as shown in FIG. 7, an embodiment of the present invention provides a pad structure 50 which includes a copper pad 52, an aluminum pad 54 above the copper pad 52, and a plurality of recessed pad areas 56 formed in the aluminum pad 54, such that the pad 54 consist consists of a plurality of slots 56 and islands 58. FIGS. 5-8 illustrate a passivation scheme which may be used to provide such a pad structure. The passivation scheme includes the following steps:

1. Define oxide slots/islands in the pad area post R2 module (see FIG. 5).
   a. Perform the same steps as the scheme described with regard to FIGS. 3 and 4, up to Passivation 1 deposition (SiN/Oxide) (identified with reference numeral 60 in FIG. 5); and
   b. Slotted Passivation 1 mask and etch to define slots/islands in the oxide 61 (in FIG. 5, the mask is identified with reference numeral 62, and the slots and islands which are formed as a result of the etching are identified with reference numerals 64 and 66, respectively).

2. Slotted/Island aluminum pad formation (see FIG. 6).
   a. TaN/Al—Cu metal stack and hard mask (SiON) deposition; and
   b. Aluminum pad mask and etch to form slotted/island aluminum pad (in FIG. 6, the aluminum pad is identified with reference numeral 54, the mask is identified with reference numeral 72, the slots which are formed by the etching is identified with reference numeral 56, and the islands are identified with reference numeral 58).

3. Passivation 2 deposition and opening of pad (final pad structure) (see FIG. 7).
   a. Deposit Passivation 2 Stack (Oxide/SiN/Oxide/SiN) (identified with reference numeral 73 in FIG. 7); and
   b. Passivation 2 mask and etch to open the pad area 74 for bonding (i.e., to the slots 56).

Figure 5:
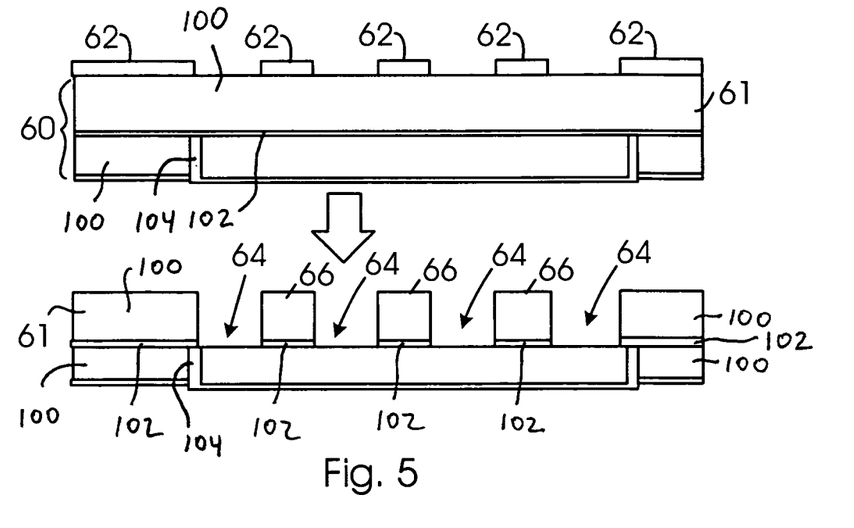
FIG. 5 provides cross-sectional views relating to a passivation scheme which is in accordance with an embodiment of the present invention, wherein a plurality of oxide slots are formed in pad areas, post R2 module.
Figure 8:
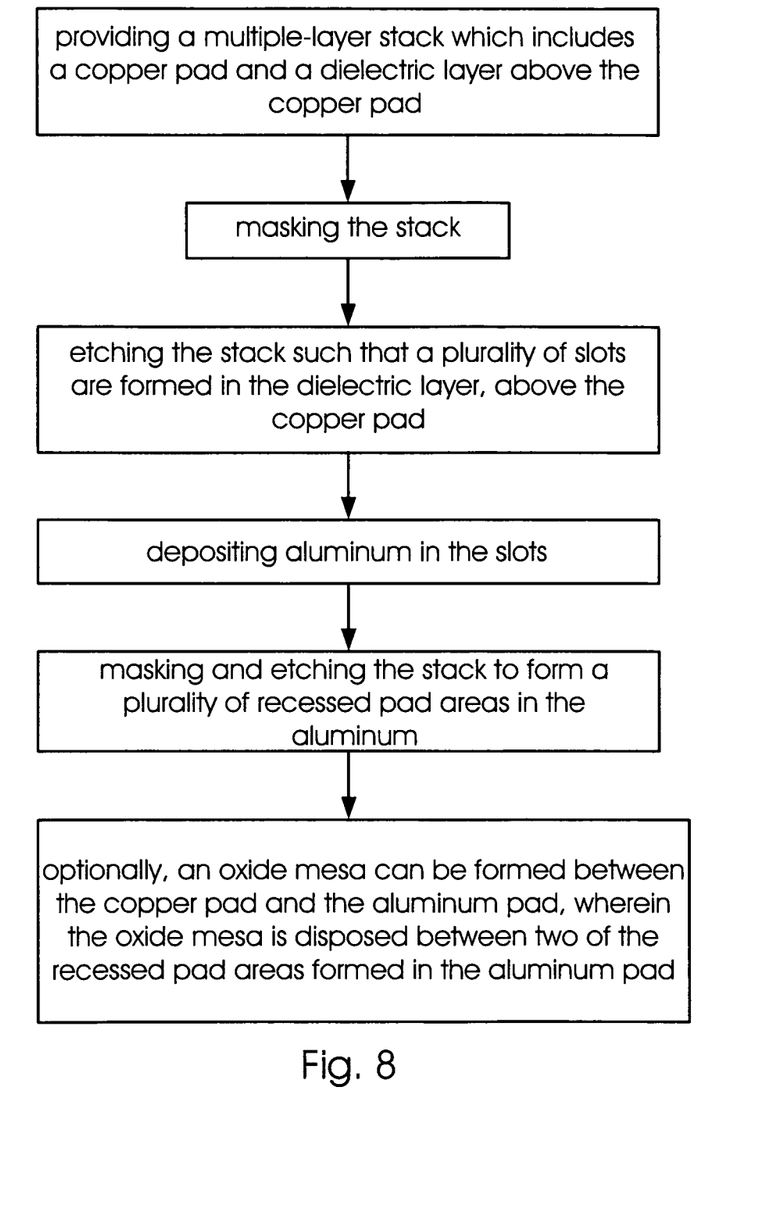
FIG. 8 is a block flow diagram which illustrates a passivation scheme which can be used to obtain the pad structure shown in FIG. 7.

FIG. 8 is a block flow diagram which illustrates the passivation scheme which can be used to obtain the pad structure 50 shown in FIG. 7, and is self-explanatory in light of FIGS. 5-7 and the foregoing description.

Figure 9:
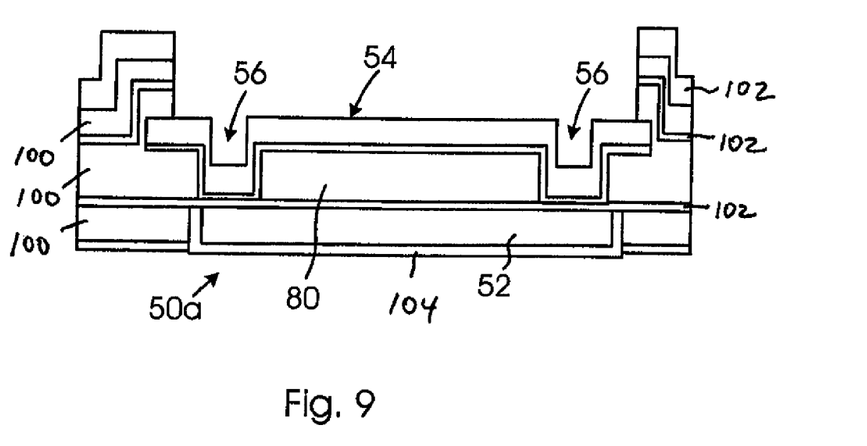
FIG. 9 provides a cross-sectional view relating to a pad structure which is in accordance with another embodiment of the present invention, wherein an oxide mesa is formed under the aluminum pad.

FIG. 9 illustrates a pad structure 50a which is in accordance with another embodiment of the present invention, wherein an oxide mesa 80 is formed under the aluminum pad 54, between two slots 56 (i.e., pads). The scheme used to form such a pad structure may be the same integration flow as described above with regard to FIGS. 5-8, but using a different passivation mask in order to create the oxide mesa 80 at the center of the pad with peripheral perimeter contact to the metal R2 pad 52 below.

The primary advantage of the pad structure shown in FIG. 9 is that the local stress in the aluminum film 54 is dictated by the large interface between the oxide mesa 80 and the aluminum pad film 54 and not by the interface between the tensile copper pad 52 and the aluminum film 54. This results in more controlled IMC formation and growth as well as the formation of the desired IMC phases that reduce crack formation and propagation.

Additional integration schemes can be used to limit the copper film/aluminum film interface and replace it with the more compressive IMD film/aluminum film interfaces offering the advantage listed above. These structures formed using different structure metal R2 Trench/Via masks or Passivation 1 Mask combinations to define the pad region are described below.

Figure 10:
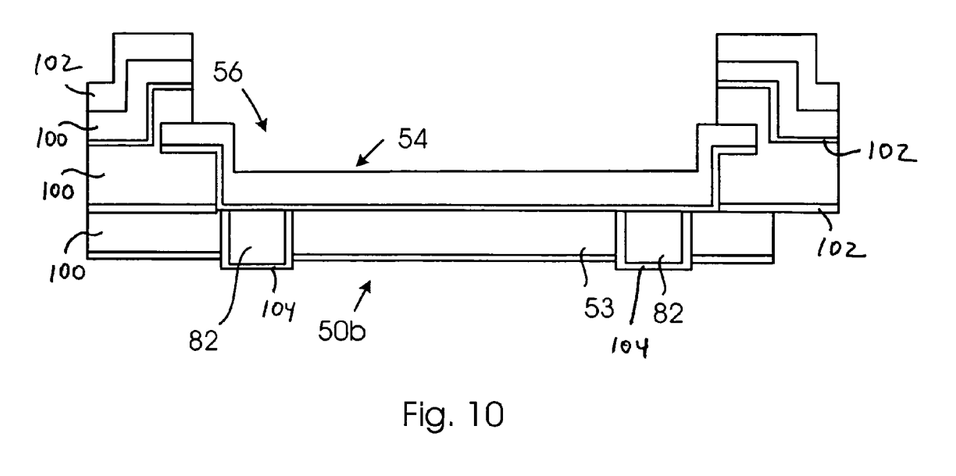
FIG. 10 provides a cross-sectional view relating to a pad structure which is in accordance with still another embodiment of the present invention, wherein a single slot is formed in the aluminum pad, but the aluminum pad is above a plurality of copper pads.
Figure 11:
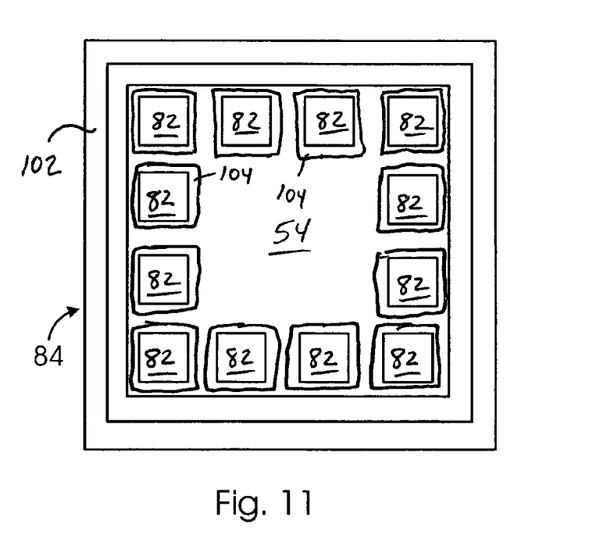
FIG. 11 provides a top view of a wafer, wherein the pad structure shown in FIG. 10 is used in association with peripheral vias.
Figure 12:
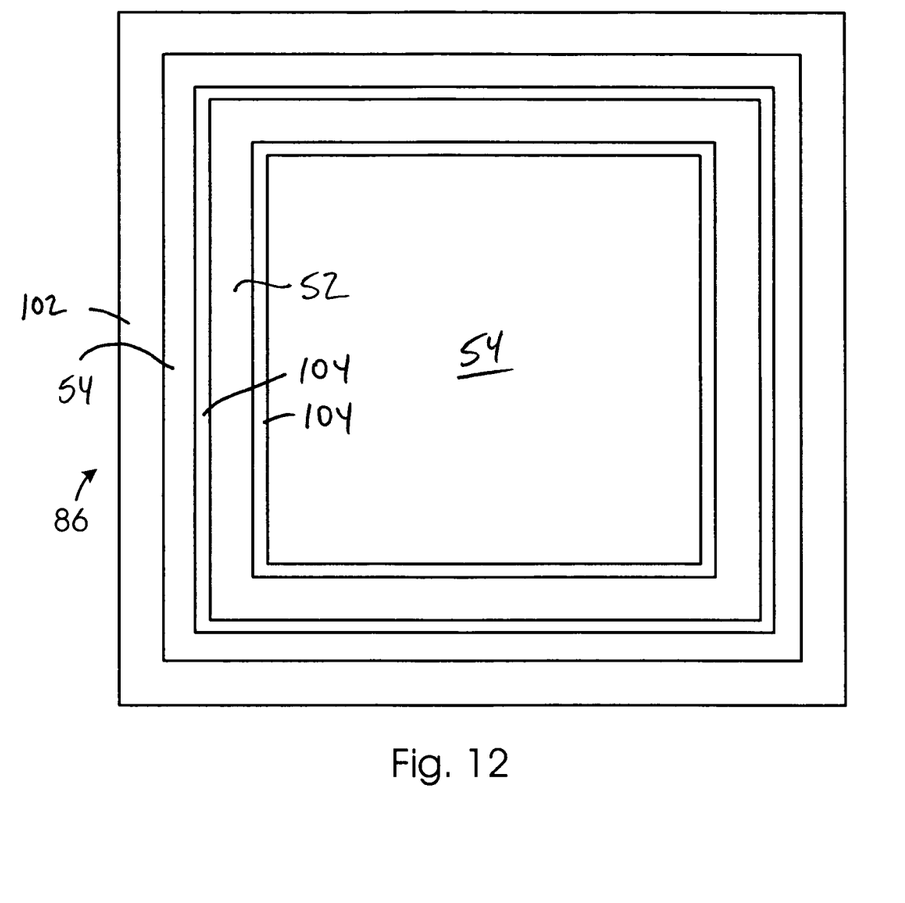
FIG. 12 provides a top view of a wafer, wherein the pad structure shown in FIG. 10 is used in association with peripheral trenches.
Figure 13:
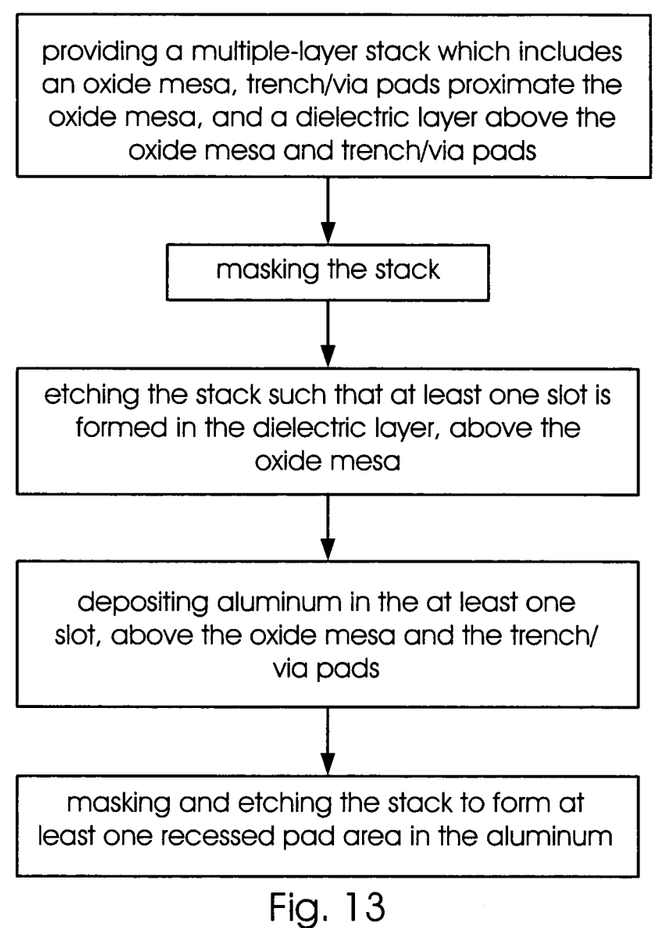
FIG. 13 is a block flow diagram which illustrates a passivation scheme which can be used to obtain the pad structure shown in FIG. 10.

FIG. 10 provides a cross-sectional view relating to a pad structure 50b which is in accordance with still another embodiment of the present invention, wherein a single slot 56 is formed in the aluminum pad 54, and peripheral via/trench pad structures 82 are provided under the aluminum pad 54, on each side of an oxide mesa 53. FIG. 11 shows a wafer 84 where the pad structure 50b shown in FIG. 10 is used in association with peripheral vias, and FIG. 12 shows a wafer 86 where the pad structure 50b shown in FIG. 10 is used in association with peripheral trenches. FIG. 13 is a block flow diagram which illustrates a passivation scheme which can be used to obtain the pad structure 50b shown in FIG. 10, and is self-explanatory in light of FIG. 10 and the foregoing description.

Figure 14:
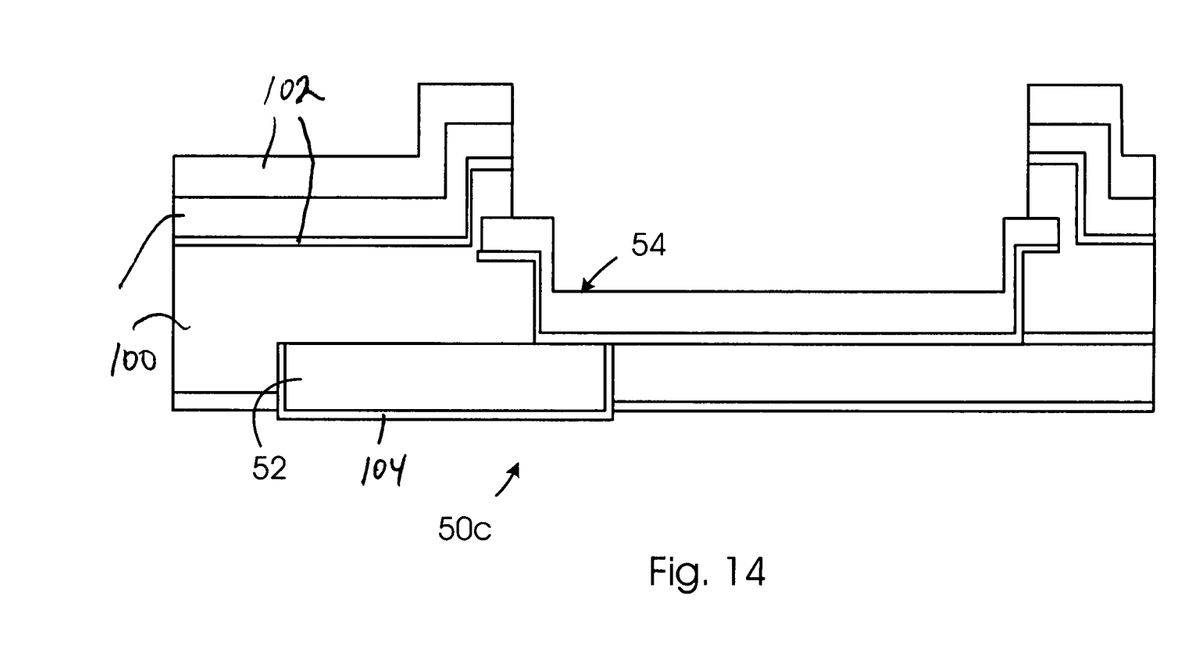
FIG. 14 provides a cross-sectional view relating to a pad structure which is in accordance with still another embodiment of the present invention, wherein an aluminum pad is staggered relative to a copper pad under the aluminum pad.
Figure 15:
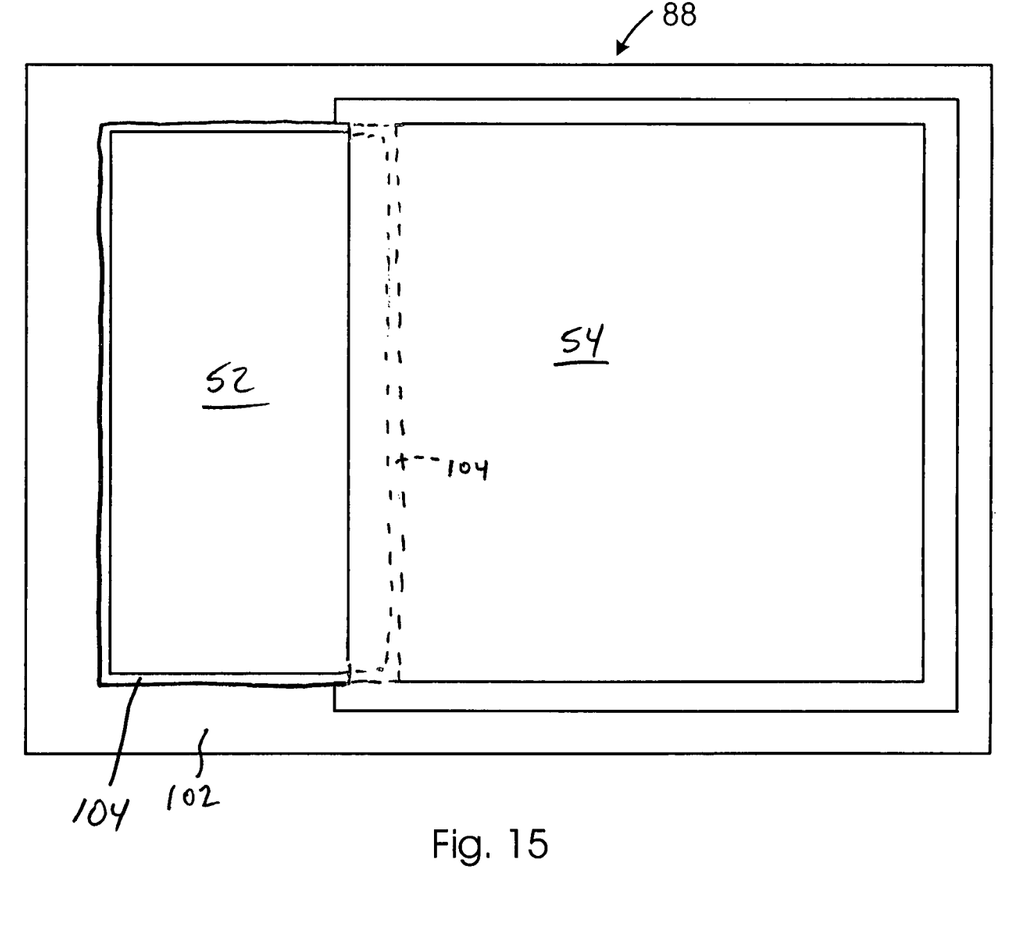
FIG. 15 provides a top view of a wafer, wherein the pad structure shown in FIG. 14 is being utilized.
Figure 16:
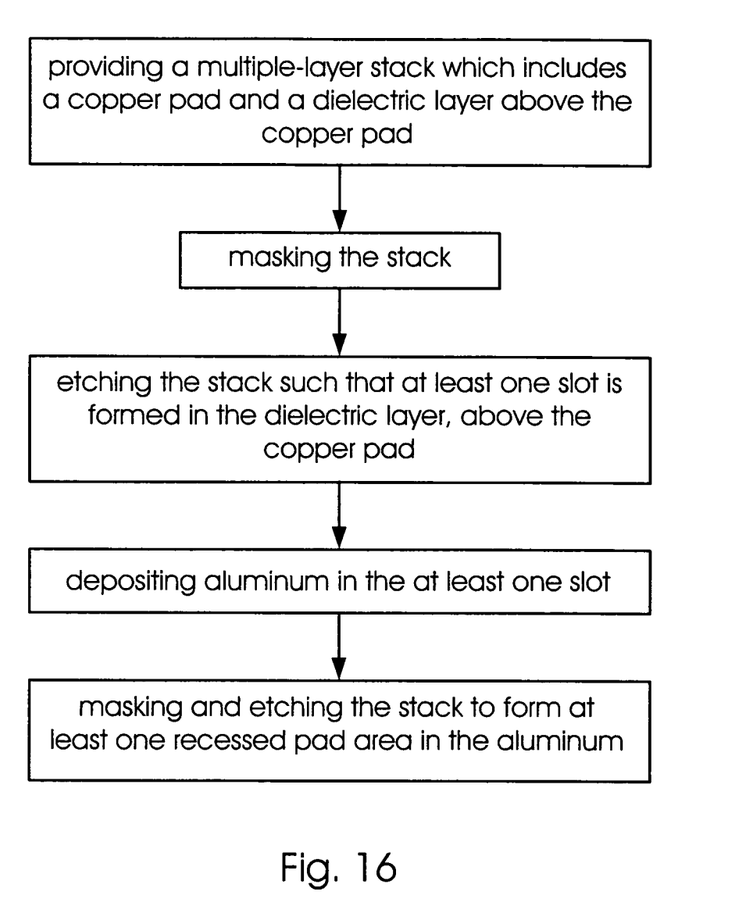
FIG. 16 is a block flow diagram which illustrates a passivation scheme which can be used to obtain the pad structure shown in FIG. 14.

FIG. 14 provides a cross-sectional view relating to a pad structure 50c which is in accordance with still another embodiment of the present invention, wherein an aluminum pad 54 is staggered relative to a copper pad 52 under the aluminum pad 54. FIG. 15 provides a top view of a wafer 88, wherein the pad structure shown in FIG. 14 is being utilized. FIG. 16 is a block flow diagram which illustrates a passivation scheme which can be used to obtain the pad structure 50c shown in FIG. 14, and is self-explanatory in light of FIG. 14 and the foregoing description.

The present invention proposes passivation integration schemes and pad structures which reduce the stress gradients and/or improve the contact surface existing between the aluminum in the pad and the gold wire bond. This results in more uniform IMC formation and increased surface area, and helps in reducing the IMC crack initiation and propagation between the Al—Au interface and improves the reliability of wire bonded parts with Cu/Low-K metallization.

While embodiments of the present invention are shown and described, it is envisioned that those skilled in the art may devise various modifications of the present invention without departing from the spirit and scope of the appended claims.

What is claimed is:

1. A pad structure comprising: at least one copper pad; an aluminum pad above the copper pad, and a plurality of recessed pad areas formed in the aluminum pad above one of said at least one copper pad, wherein the aluminum pad provides a plurality of slots each having a top surface and a plurality of islands each having a top surface, wherein the top surface of each of the slots extends deeper than the top surface of each of the islands, wherein the pad structure further comprises oxide blocks in the islands, each of said oxide blocks having a top surface, wherein the top surface of each of the slots extends deeper than the top surface of the oxide blocks in the islands, wherein said plurality of slots comprises a first slot and a second slot, wherein there are a plurality of slots and islands disposed between the first slot and the second slot, above one of said at least one copper pad; a first layer along an entire bottom surface of the aluminum pad and in contact with the top surface of each oxide block; and a second layer along an entire top surface of the at least one copper pad and in contact with both the oxide blocks and portions of the first layer.

2. A pad structure as recited in claim 1, wherein the aluminum pad is above a single copper pad.

3. A pad structure as recited in claim 1, wherein the second layer comprises a single nitride layer.

* * * * *